US006982378B2

(12) United States Patent
Dickson

(10) Patent No.: US 6,982,378 B2
(45) Date of Patent: Jan. 3, 2006

(54) LOSSY COATING FOR REDUCING ELECTROMAGNETIC EMISSIONS

(75) Inventor: Andrew H. Dickson, Fair Oaks, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/383,387

(22) Filed: Mar. 7, 2003

(65) Prior Publication Data

US 2004/0173368 A1 Sep. 9, 2004

(51) Int. Cl.
*H05K 9/00* (2006.01)

(52) U.S. Cl. .......................................................... 174/36

(58) Field of Classification Search ............. 174/35 R, 174/35 GC, 35 MS, 36, 102 SC, 106 SC, 174/120 SC; 333/1, 12

See application file for complete search history.

(56) References Cited

U.S. PATENT DOCUMENTS

| | | | | |
|---|---|---|---|---|
| 4,383,225 A * | 5/1983 | Mayer | ......................... | 333/12 |
| 4,499,438 A | 2/1985 | Cornelius et al. | | |
| 4,503,284 A | 3/1985 | Minnick et al. | | |
| 4,816,614 A | 3/1989 | Baigrie et al. | | |
| 4,920,233 A | 4/1990 | Kincaid | | |
| 5,171,937 A * | 12/1992 | Aldissi | ........................ | 174/36 |
| 5,262,592 A | 11/1993 | Aldissi | | |
| 5,313,017 A | 5/1994 | Aldissi | | |
| 5,539,148 A * | 7/1996 | Konishi et al. | ........... | 174/35 R |
| 6,225,565 B1 | 5/2001 | Prysner | | |
| 6,399,737 B1 | 6/2002 | Elkovitch | | |
| 6,492,588 B1 * | 12/2002 | Grandy | ........................ | 174/36 |

* cited by examiner

*Primary Examiner*—Hung V. Ngo

(57) ABSTRACT

An EMI reduction system comprises a conductor and a lossy coating encasing the conductor and comprising one or more lossy layers. The one or more lossy layers further comprise a binder and a lossy material mixed into the binder. The lossy material is selected to attenuate electromagnetic interference frequencies in a narrow or moderate band.

18 Claims, 9 Drawing Sheets

LOSSY COATING FOR REDUCING ELECTROMAGNETIC EMISSIONS

BACKGROUND OF THE INVENTION

1. Field of the Invention

The invention relates to devices, techniques, and treatments for reducing or eliminating electromagnetic interference.

2. Relevant Background

Electromagnetic interference (EMI) can arise in any electronic system, either directly from circuitry or indirectly by conduction along connecting cables and by radiation. EMI can also arise from external sources to create problems in various systems. Undesirable signals occur whenever interference has a source, a receiver, and a transfer path. Accordingly, EMI can be reduced or eliminated by suppressing interference at the source, protecting the receiver against interference, and by reducing transmission.

Interference can propagate by radiation of electromagnetic waves in free space and by conduction on a conductive pathway. Techniques for suppressing radiated interference include shielding with conductive or absorbing materials such as conductive adhesive tapes, wire mesh, and gaskets. Techniques for suppressing conducted interference includes ferromagnetic cable shields, connector backshields, filtered connectors, ferrite toroids, and feedthrough capacitors that all reduce emissions conducted onto connecting cables. Conducted emissions generally concern signal frequencies of up to 30 MHz while radiated emissions have a frequency range of generally over 30 MHz.

Electromagnetic compatibility is regulated throughout the world. European Norms (EN) define regulations applicable in all European Union (EU) and European Free Trade Associated (EFTA) countries. Federal Communications Commission (FCC) regulates electromagnetic compatibility in the United States. Other agencies regulate emissions in other countries throughout the world.

Fundamentally, EMI should be addressed using good design practice to eliminate interference in design requirements. Design practice may be ineffective for interference that is directly related to inherent operating principles and for interference that is not detected until the final design phase. Further, combining components into systems not originally anticipated may cause unexpected EMI problems. Additional suppression may be needed using extra suppression components such as ferrites, capacitors, or shielding elements.

Referring to FIG. 9, a pictorial diagram illustrates several examples of conventional wire and cable shielding devices including toroids. Conventional techniques for improving electromagnetic noise emission involve placement of a ferrite toroid on the wire or cable. The toroid solution reduces EMI in some frequency ranges but has the disadvantages of increased material costs, increased assembly costs, and difficulty in installation from complexity in routing and dressing. Toroids are inconvenient since a cable that is intended to pass through a hole of only slightly larger diameter than the cable can no longer pass when the toroid is installed. A toroid is a ring-shaped solid lossy element that is commonly manufactured by combining a ferromagnetic powder into a substrate, and placing the combination into a mold for sintering at high pressure and temperature. One or more toroids can be placed around the cable, either by sliding the ring over the end of a cable or by snapping a split toroid into place on the cable. Toroids are typically ceramics that have the disadvantage of high fragility; the ferrite material commonly used for toroids can fracture in use. A fractured toroid has greatly reduced attenuation capability. For long cables, multiple toroids must be used to remedy differential-to-common mode conversion, increasing cost and complexity while reducing reliability.

Toroids can be porous, possibly resulting in moisture absorption or requiring shrink tubing overlying the toroids for physical and moisture protection. Other, similar applications of solid lossy materials have similar problems of cost, fragility, and installation difficulty.

SUMMARY OF THE INVENTION

According to some embodiments of the disclosed EMI reduction system and method, an apparatus comprises a conductor and a lossy coating encasing the conductor and comprising one or more lossy layers. The one or more lossy layers further comprise a binder and a lossy material mixed into the binder. The lossy material is selected to attenuate electromagnetic interference frequencies in a narrow or moderate band.

According to other embodiments, an electromagnetic interference-protected cable comprises one or more interior conductor cables, a shield coupled to and encasing the one or more interior conductor cables, and a plurality of lossy layers coupled to and encasing the shield and the one or more interior conductor cables. The individual lossy layers of the plurality of lossy layers have different compositions selected to attenuate frequencies in multiple frequency bands.

According to further embodiments, a method for protecting against electromagnetic interference and electromagnetic pulse signals comprises determining an interference frequency band within which electromagnetic interference is to be attenuated. The method further comprises mixing a lossy material into a binder in a composition and concentration that attenuates electromagnetic interference in the determined frequency band and forming the mixed lossy material and binder over a conductor.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION

Figure 1:
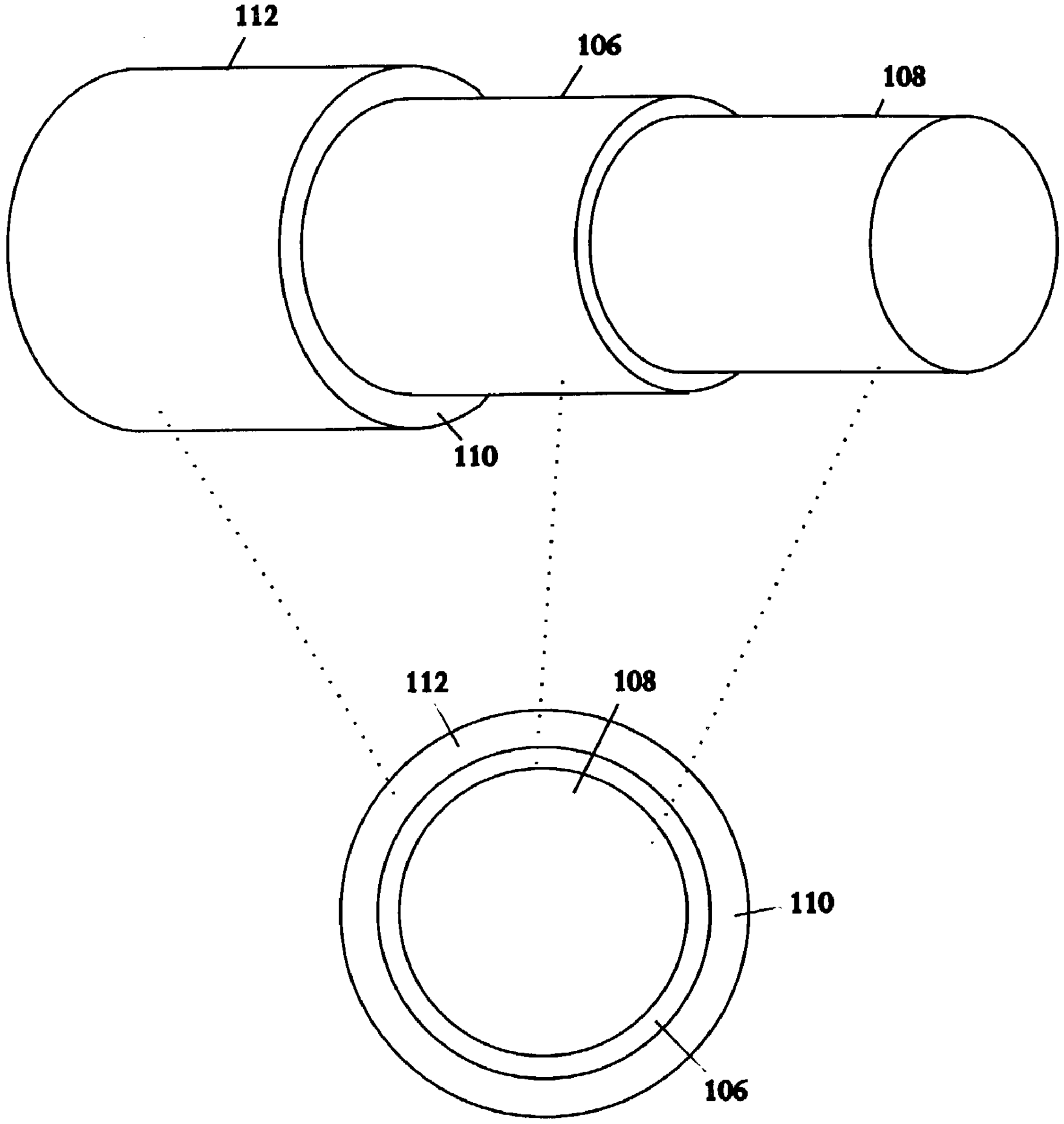
FIG. 1 is a highly schematic pictorial diagram illustrating an example of a shielded wire or cable with one or more layers of lossy material with specified frequency characteristics that reduce electromagnetic emissions.

What is desired is an apparatus and method capable of improving the reduction or elimination of electromagnetic interference and similar applications of solid lossy material. What is further desired is an EMI solution that avoids the difficulties imposed by toroids.

A coating comprised of one or more layers of lossy material with specified frequency characteristics encases a conductor such as a wire or cable to reduce electromagnetic emissions. A lossy material can be incorporated into a binder to form wire insulation or a cable jacket in the one or more layers to dissipate radio frequency (RF) energy that can radiate from the wire or cable to cause electromagnetic interference (EMI). In addition to reducing or eliminating EMI radiated by product or system, shielding using the specified lossy materials can enhance noise immunity, reducing susceptibility to externally generated electromagnetic fields and sources.

In some embodiments, a single lossy material layer encases the wire or cable with the lossy material selected and implemented with particular characteristics to reduce or eliminate electromagnetic interference within a selected frequency band.

In other embodiments, the wire insulation or cable jacket is implemented with multiple lossy layers using one or more lossy materials to reduce or eliminate interference in an entire frequency spectrum of interest. Typically, the various layers of the two or more lossy layers are selected to have different frequency response characteristics to broaden the band of frequencies of the electromagnetic interference. Application of multiple lossy layers permits selection of materials that have higher losses over a narrow frequency range, increasing the total attenuation of EMI. Electromagnetic interference generally encompasses a wide band of frequencies so that a lossy wire insulator or cable jacket should eliminate or reduce interference throughout a wide frequency range. With a single lossy layer, a broadband material is to be used to eliminate interference in as wide a frequency range as is possible. Broadband materials by nature do not have as high an attenuation at specific frequencies as materials intended for a narrower bandwidth.

The individual layers of the multiple lossy coatings can be designed to reduce or eliminate interference at selected frequency bands by choice of materials and control of properties and densities of the chosen materials.

Multiple coatings in separate sheaths coupled in adjacent layers can produce a greater attenuation than the same materials mixed in the same matrix. Multiple layer shielding permits usage of narrow spectrum absorbers to increase attenuation.

Application of multiple lossy layers permits selection of particular lossy materials to enhance reduction of particular problematic frequencies.

A cable and wire coating system that enables usage of multiple coating layers and specification of the frequency coverage of the individual layers allows a manufacturer to flexibly supply EMI reduction materials for a broad range of applications and frequency bands while stocking a low number of lossy materials.

Lossy material can be incorporated into the insulation or jacket by mixing into a molten thermoplastic insulating material or by extruding the lossy material or otherwise applying the lossy material around the cable or wire.

Enclosing the wire or cable in multiple lossy layers improves electromagnetic noise emission in comparison to conventional techniques that involve placement of a ferrite toroid on the wire or cable. The toroid solution does reduce or eliminate EMI in some frequency ranges but has the disadvantages of increased material costs, increased assembly costs, and difficulty in installation from complexity in routing and dressing. Toroids are also inconvenient since a cable that is intended to pass through a hole of only slightly larger diameter than the cable can no longer pass when the toroid is installed.

The lossy layers can be incorporated into cables with or without a metallic shield.

Referring to FIG. 1, a highly schematic pictorial diagram illustrates an example of a shielded wire or cable 100 that is shielded by a shield braid 106 and a coating 110 comprising one or more lossy layers 112. The one or more lossy layers 112 are concentrically positioned around the core 108. The lossy layers 112 includes lossy material with specified frequency characteristics and encases an electrically conductive core of wire or cable 108 to reduce electromagnetic emissions. Typically, the wire or cable 108 is used to transmit electrical signals and/or electrical power with the coating 110 isolating the wire or cable 108 from the exterior environment, either protecting the conductive core 108 from ambient electromagnetic emissions or protecting the external environment from EMI from the core 108.

The electrically conductive core of wire or cable 108 typically is composed of circularly-sectioned drawn wire stock of an electrically conductive material selected for conductivity, weight, compatibility and cost. Suitable electrically conductive materials include copper, silver, gold, and other conductive metals and alloys.

The shield braid 106 is typically constructed from a lightweight, metallized, high-tensile strength fiber that is braided or formed into a mesh. In some examples, the braid 106 is from about 1 to approximately 10 mils thick. A suitable material for the braid 106 is silver-coated aramid fiber braid. Other high-tensile fibers include nylon, nomex, and the like. In various embodiments, the shield braid 106 can be formed concentrically above or below the coating 110. The shield braid 106, like the coating 110, functions to shield against interference signals.

Braid 106 functions as a shield around the conductor 108 in the form of wire braid wire strands overlaid around the conductor 108. Current flowing in the conductor 108 can generate a current flowing in the shield braid 106, possibly causing the braid 106 to radiate energy for long lengths of wire or cable. Radiation can cause the braid 106 to lose effectiveness in reducing interference. The one or more lossy layers 112 reduce or prevent energy radiation, effectively reducing interference.

Some embodiments of a cable may omit the braid 106. For example, in some applications such as cabling between two isolated equipment units, a conductive braid 106 is not desirable since a conductive path between chassis of the two units can be detrimental to operation.

Any suitable lossy material such as a ferrite or other lossy material can be incorporated into wire insulation or cable jacket 112 in the one or more layers to dissipate radio frequency (RF) energy that can radiate from the wire or cable 108 to cause electromagnetic interference (EMI). Typical ferrite materials that can be incorporated into the one or more lossy layers 112 include nickel-zinc (NiZn) ferrites, manganese-zinc (MnZn) ferrites, and others. Particular NiZn and MnZn materials can be fabricated to have various selected proportions of the composite elements and to have various selected densities in a base material to attain particular attenuation performance at particular frequency bands.

Base material of the lossy layers 112 is a binder that can be composed of a flexible insulating material, the particular material being selected based on considerations of insulative properties, weight, flexibility and cost. The base material typically comprises an elastomer or thermoplastic material such as poly-vinyl-chloride (PVC), polyethylene (PE), polypropylene (PP), or other suitable materials.

The one or more lossy layers 112 reduce or eliminate EMI radiated by a product or system at the frequency bands and at the attenuation levels according to the particular configuration of one or more lossy material layers, and can enhance noise immunity by reducing susceptibility to externally-generated electromagnetic fields and sources.

In the illustrative wire or cable 100, a single lossy material layer 112 encases the wire or cable 108 with the lossy material selected and implemented with particular characteristics to reduce or eliminate electromagnetic interference within a selected frequency band.

The one or more layers 112 of the coating 110 typically are comprised of the base material or binder with embedded lossy material particles, for example embedded metal particles. Some manufacturing methods comprise mixing metal particles into the base material in the form of a flowable liquid component that is elastomeric in a solid state.

The coating 110 comprises one or more layers 112 of a binder loaded with a lossy material concentrically disposed about the inner conductor 108 creating an isotropic conductivity that is desirable in an effective Faraday shield.

The binder can be composed of one or more of a variety of elastomers, thermoplastics, and other materials. Suitable thermoplastics include poly-vinyl-chloride (PVC), polyethylene (PE), polypropylene (PP), and other specially formulated plastics. PVC is flexible, resists weathering and ultraviolet rays that degrade many plastics, and is available in a wide range of durability and hardness varieties from hard and stiff to soft and spongy. PE is inexpensive with good chemical and weathering resistance, and has a wide variety of hardness from stiff to flexible, depending on wall thickness. PP has good abrasion and chemical resistance but poor ultraviolet and weathering resistance. PP is lightweight and easy to process. PVC, PE, and PP have generally average operating temperature ranges of about 35° C. to 95° C. Specially formulated plastics are available such as Lolon© varieties A, B, E, F, G, H, I, J, K, L, and M from Loos & Co. of Pomfret, Conn., that have selected characteristics of impact, fatigue, abrasion, chemical, moisture, mildew, fungus, and weathering resistance, flexibility, toughness, hardness, rigidity, and operating temperature range.

The binder can further be composed of other thermoplastic resins such as polycarbonates, polyesters, polyetheresters, polyestercarbonates, polyamides, polyamideimides, polystyrenes, polyethers, polyetherimides, polyaryleneethers, acrylonitrile-butadiene-styrene copolymers, and combinations of two or more thermoplastic resins. U.S. Pat. No. 6,399,737 to Elkovitch entitled "EMI-Shielding Thermoplastic Composition, Method for the Preparation Thereof, and Pellets and Articles Derived Therefrom", which is hereby incorporated by reference in its entirety, describes the thermoplastic resins and manufacturing techniques.

The binder can also be a polymeric matrix such as Viton, a fluorinated elastomeric polymer manufactured by E. I. du Pont de Nemours and Company of Wilmington, Del.

Material used in the binder may include materials selected for lossy characteristics and permeability characteristics. Various lossy materials may be used such as nickel-zinc (NiZn) ferrites, manganese-zinc (MnZn) ferrites, flakes of magnetic amorphous alloy, and other ferrites. Permeable materials may be used including high permeability iron-based (ferrous) alloy, high permeability iron-based alloy such as 4–79 Permalloy, MUMETAL®, Hymu 80, 45 Permalloy, and 50% nickel iron. The lossy materials may be either magnetically soft or can have some degree of hardness. Suitable magnetic materials can further include ferromagnetics, nickel, iron, nickel-iron alloys, silicon-iron alloys, cobalt-iron alloys, and steel. Suitable steels are those that are naturally ferromagnetic or processed to become ferromagnetic. Nickel-iron alloys have several identification or trade names including mumetal, permalloy, supermalloy, supermumetal, nilomag, sanbold, and others. In some examples, the lossy materials may be metal coated. Metal-coated lossy particles can be fabricated using techniques such as electrodeposition, vacuum deposition, and other known methods.

In some embodiments, a mixture of lossy materials and high permeability materials may be used. For example one layer may be composed of lossy materials and a second layer may include high permeability materials such as MUMETAL to dissipate interference.

In applications that include multiple layers, some layers may include lossy materials and other layers may include high permeability materials that are selected in combination to attain selected performance characteristics. In other applications, lossy and high permeability materials may be included in one or more layers.

In some cases, the lossy materials can be silver-coated magnetic particles such as ferrites, magnetites or a blend of ferrites and magnetites. Impedance characteristics of the magnetic particles vary based on composition, fabrication conditions, concentration, and the like. Ferrites are soft-magnetic, homogeneous ceramic materials that are typically composed of iron oxide ($Fe_2O_3$) with carbonates or oxides of one or more bivalent metals such as manganese, zinc, nickel, or magnesium.

In some embodiments, the lossy layer 112 can be constructed of ferromagnetic particles mixed with other metal particles including one or more of copper, silver, silver-coated copper, nickel, manganese, zinc, and others into a polymer matrix. For example, metal-coated ferrites and magnetites can be mixed with the other metal particles. For a lossy layer 112 that includes ferromagnetic materials mixed into the polymer matrix in combination with other metal particles, the matrix comprises approximately 10 to 90% by weight of the metal blend. The metal coating on the particles can range from approximately 5% to 95% of the entire particle weight.

In some embodiments, the one or more lossy layers 112 of the coating 110 include an electromagnetic shielding agent that comprises metal-coated particles in combination with metal particles. Suitable core materials for the metal-coated particles include vitreous mineral such as glass, silicates of aluminum, magnesium, calcium, and similar elements. Other suitable core materials include inorganic carbon materials such as kevlar, graphite, carbon powders, carbon particles, mica, and composites. The metal coating is any metal capable of enhancing the shield effectiveness of thermoplastic resins, for example silver, gold, copper, aluminum, nickel, platinum, and alloys of one or more of the listed metals. A particular example is silver-coated vitreous mineral particle. The metal content of the metal-coated particles may range from about 1 to about 30 weight percent, based on the total weight of the metal-coated particle. Metal-coated particles may have a concentration in the layer 112 in a range from about 0.1 to approximately 30% of the total composition weight. The metal particles in the electromagnetic shielding agent may be any conductive metal, alloy, or combination of one or more of iron, copper, aluminum, nickel, and titanium. A specific example is a stainless steel alloy of iron with chromium, nickel, carbon, manganese, and molybdenum.

The lossy coating 110 can be used to cover wires or cables for any application, for example including local area network (LAN) cables, interconnect cables, power cables, or any other type of cable. The lossy coating 110 is useful in any interconnect cable where noise emission is an issue, including all computer applications of serial cables, centronics/parallel ports, Small Computer Serial Interface (SCSI) cables, LAN cables, telephone and telecommunications cables, power cables. Other applicable computer cables include A-D converters, signal lines, measuring circuits, RF cables, sound card cables, modem lines, DMA cables, PCMCIA cables, NIC's, token ring, fiber channel, and the like.

Figure 2:
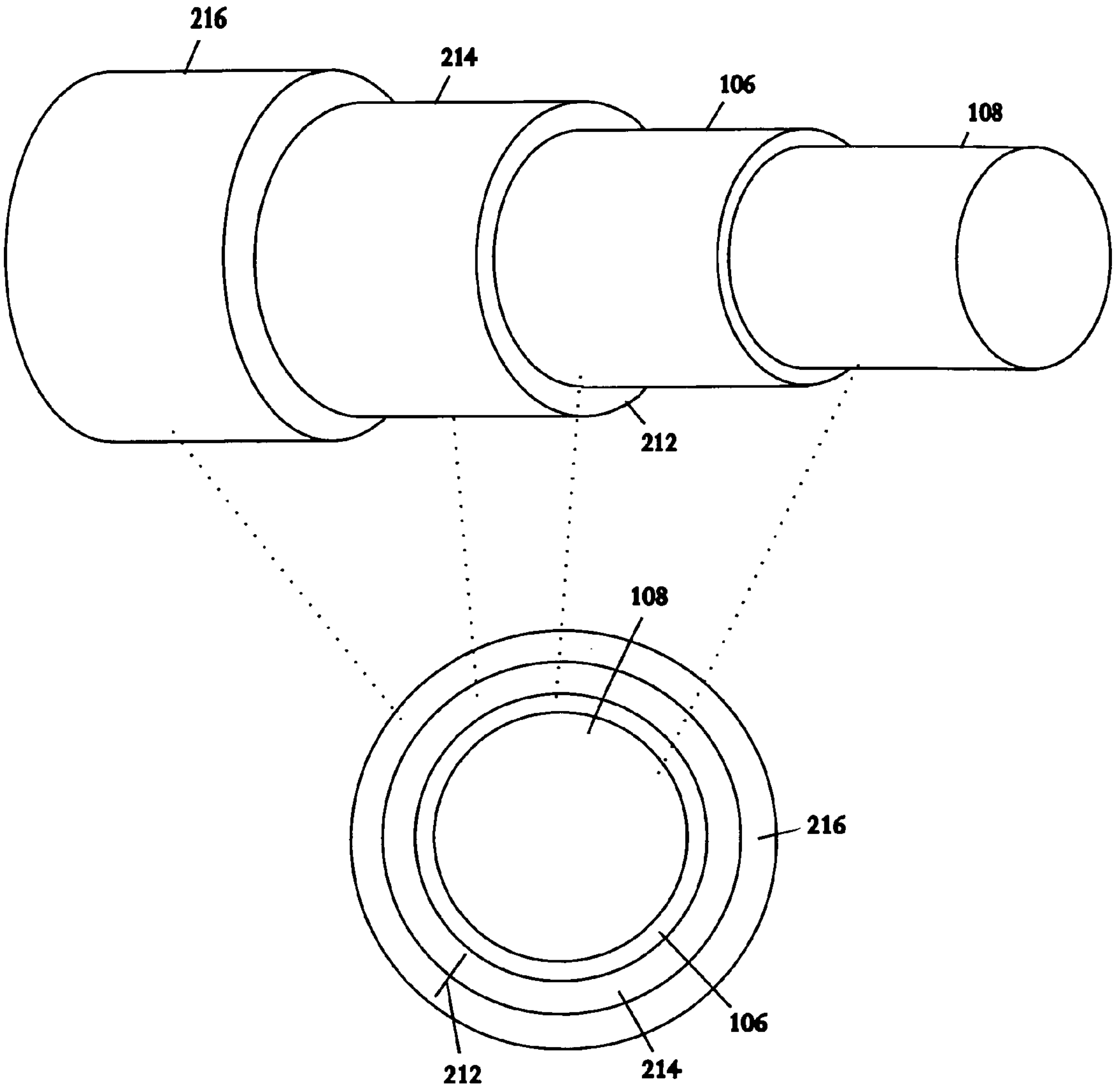
FIG. 2 is a pictorial diagram that depicts shielding in the form of wire insulation or a cable jacket with multiple lossy layers using one or more lossy materials to reduce or eliminate interference in a frequency spectrum of interest.

Although the example shown in FIG. 1 and subsequent figures are single-conductor wires or cables, other embodiments may include single, dual, or multiple conductors. The lossy coating 110 can be used on power conductors, for example "Romex" conductors and can be used on heavy, high-current conductors or bus bars. In addition to tubular cable shielding for coaxial cable, the lossy wire or cable coating can also be applied to rectangular cores for flat ribbon cables Referring to FIG. 2, a pictorial diagram depicts coating 212 in the form of wire insulation or cable jacket with multiple lossy layers 214 and 216 using one or more lossy materials to reduce or eliminate interference in an entire frequency spectrum of interest. Although two lossy sheaths 214 and 216 are shown, any suitable number of layers may be implemented. Some examples may include three or four layers, other examples include additional layers to achieve particular frequency and attenuation performance. The number of lossy layers may be optimized depending on the application to attain desired frequency performance and attenuation goals while taking into account manufacturing complexity and cost.

Various layers of the two or more lossy layers 214 and 216 can be selected to have different frequency response characteristics to broaden the band of frequencies of the electromagnetic interference to be reduced or eliminated.

Although the illustrative pictorial diagram includes a braid shield 106, in some applications the braid shield 106 may be omitted to attain a desired functionality.

Figure 3A:
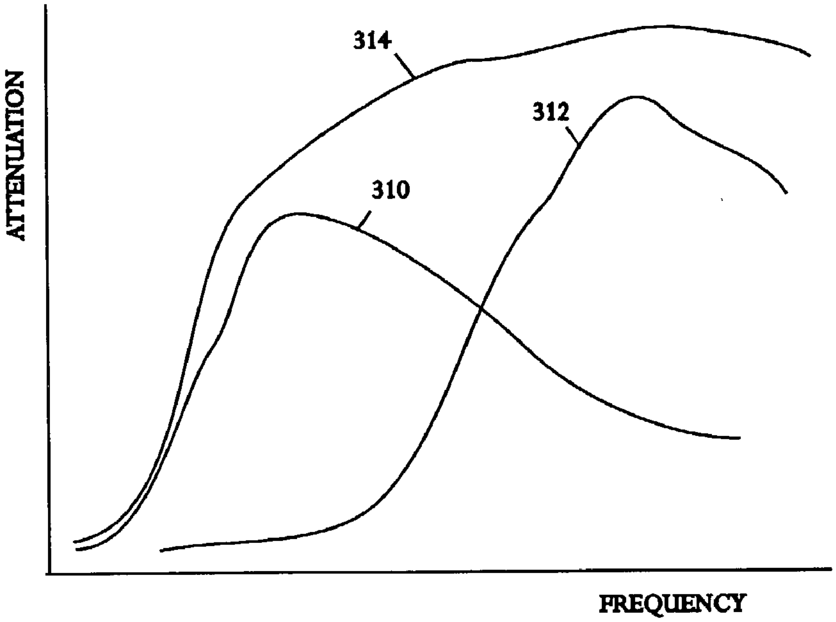
FIGS. 3A and 3B are frequency response graphs showing attenuation and frequency relationships for the multiple lossy layers coatings and a single layer, respectively.
Figure 3B:
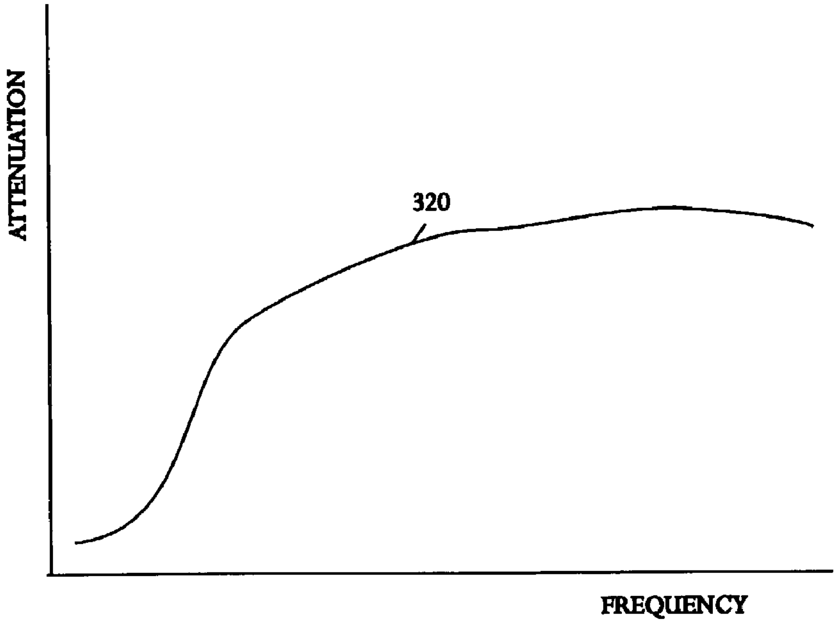

Referring to FIG. 3A, frequency response graphs show the relationship of attenuation and frequency for the multiple lossy layers 214 and 216. Lossy materials can be designed using selected materials that individually have higher losses over narrow frequency ranges 310 and 312 that overlap, increasing the total attenuation of EMI when combined 314. The layer for low frequency attenuation 310 has a peak response at a low frequency and the layer for high frequency attenuation 312 has a peak response for high frequency interference. The combination of layers has a combined frequency attenuation that overlaps and generates a relatively high attenuation across an entire wide frequency band. Electromagnetic interference generally encompasses a wide band of frequencies so that a lossy wire insulator or cable jacket should eliminate or reduce interference throughout a wide frequency range. In comparison, referring to FIG. 3B, with a single lossy layer a broadband material is to be used to eliminate interference in as wide a frequency range as possible 320. Broadband materials generally have difficulty eliminating interference at a particular frequency. The attenuation effect of the multiple lossy layers 214 and 216 in combination is greater than the attenuation of the single broadband lossy material layer.

The individual layers of the multiple lossy coatings can be designed to reduce or eliminate interference at selected frequency bands 310 and 312 by choosing materials and controlling properties and densities of the chosen materials.

The illustrative cable with multiple lossy layers, each having different frequency attenuation characteristics improves over a broadband solution by increasing the maximum attenuation capability. Coating volume limits the amount of lossy material that can be disposed about the cable. For short cables, the total coating volume may be insufficient to carry enough lossy material to attain the desired attenuation while maintaining a flexible cable that is not too stiff, bulky, or difficult to manufacture. Usage of multiple lossy layers with different frequency attenuation characteristics increases the overall attenuation in comparison to broadband attenuation so that sufficient attenuation may be attained even for short cables.

Frequency attenuation of a particular lossy layer can be controlled by selection of the particular lossy materials and lossy material concentrations in a layer. For example, ferrite is particularly suited for operation under a frequency range from about 10 kHz to approximately 50 MHz. Manganese-zinc (Mn—Zn) ferrites attenuate at relatively lower frequencies in a range up to approximately 50 MHz. Nickel-zinc (Ni—Zn) ferrites, in contrast, attenuate at higher frequency ranges up to approximately 100 MHz.

Ferromagnetic resonance permeability effects the frequency attenuation of a particular layer which, in turn, depends on selection of the particular lossy material, other materials included in the layer, lossy material concentration, physical characteristics of the lossy material within a layer including the size of lossy particles. Low frequency signals are typically unaffected by cable shielding. At low frequencies, a lossy material causes a low-loss inductance, resulting in a minor impedance increase. At higher frequencies where interference becomes common, magnetic losses increase and the ferromagnetic resonance permeability frequency falls to about zero while impedance reaches a maximum value. Impedance largely determines suppression and becomes almost completely resistive at higher frequencies, even capacitive with losses at very high frequencies. Effective interference suppression can be attained at operating frequencies much higher than the resonance frequency even though the operating frequency should remain below the resonance frequency for inductor applications. Impedance peaks at the resonance frequency and the lossy material is effective for noise suppression in a wide frequency band around resonance.

Near the ferromagnetic resonance, impedance is predominantly resistive which is favorable since a low-loss inductor can resonate with a capacitance in series, resulting in a near zero impedance and interference amplification. A more resistive impedance cannot resonate and is reliable independent of source and load impedances. Furthermore, a resistive impedance dissipates rather than reflects interference. Oscillations at high frequency can damage semiconductors or alter circuit operations and are thus better absorbed. In addition, the impedance curve shape changes with material losses. A lossy material will have a smooth variation of impedance with frequency and a real wideband attenuation. Interference signals typically occur in a broad spectrum.

The lossy material in a layer is selected to attain a particular frequency attenuation. For example, Nickel-Zinc (NiZn) ferrites can be used for EMI suppression up to gigahertz frequencies and have a high resistivity that prevents eddy current induction. Manganese-Zinc (MnZn) materials have high permeability but low resistivity and generally suppress EMI in a lower frequency range. Iron powder has low permeability but a lower bandwidth than for NiZn due to low resistivity. Iron powders have a very high saturation flux density and thus are suitable for very high bias currents.

Figure 4A:
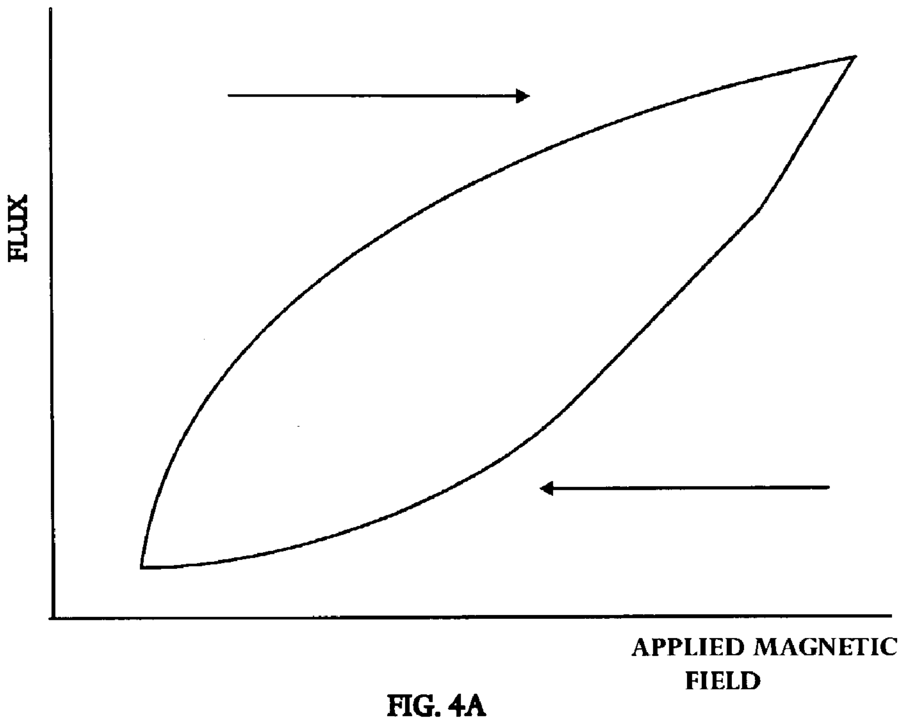
FIGS. 4A and 4B shows flux and frequency response curves for a three-layer EMI reduction cable, illustrating system hysteresis behavior.
Figure 4B:
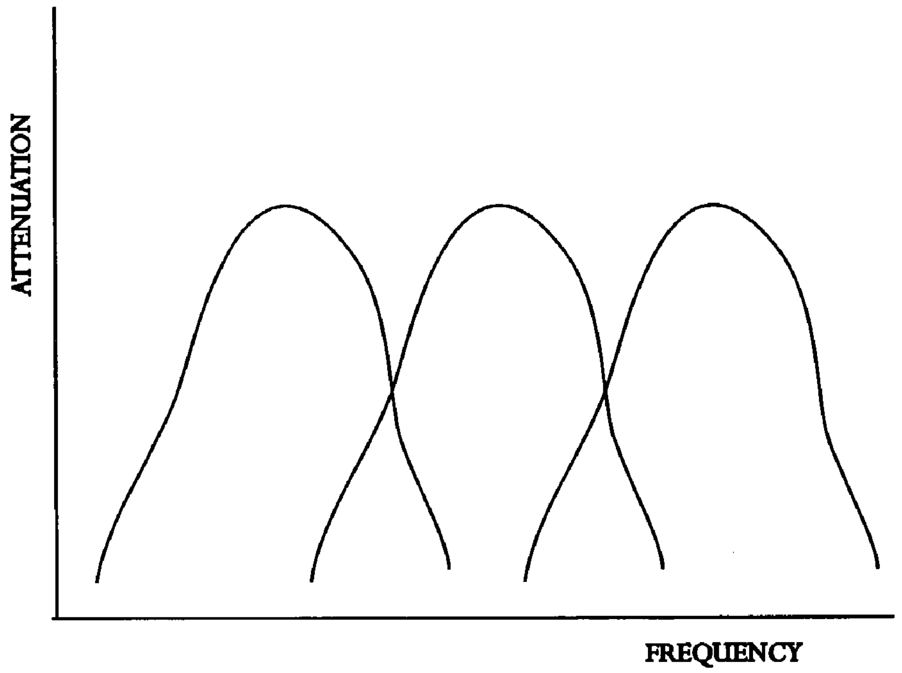

Referring to FIG. 4A, flux curves for a three-layer EMI reduction cable illustrate system hysteresis. The multiple layers are constructed to have differing frequency attenuation performance. The ordinate axis depicts flux as a function of the field, on the abscissa, into which the lossy material is immersed. The response curve depicts the flux inside the lossy material. As the field is increased, the flux within the lossy material increases but levels at some point of magnification. As the field is decreased, the curve does not retrace the magnification response but instead show a hysteresis or energy loss. For any lossy material, the larger the area of hysteresis depicts a greater lossy character of the material. Materials with varying lossy character have differing frequency attenuation characteristics, as shown in the frequency response diagrams of FIG. 4B. In some embodiments, what are desired in a particular group of lossy material layers are a relatively large loss and a relatively narrow frequency range for the individual layers.

Figure 5:
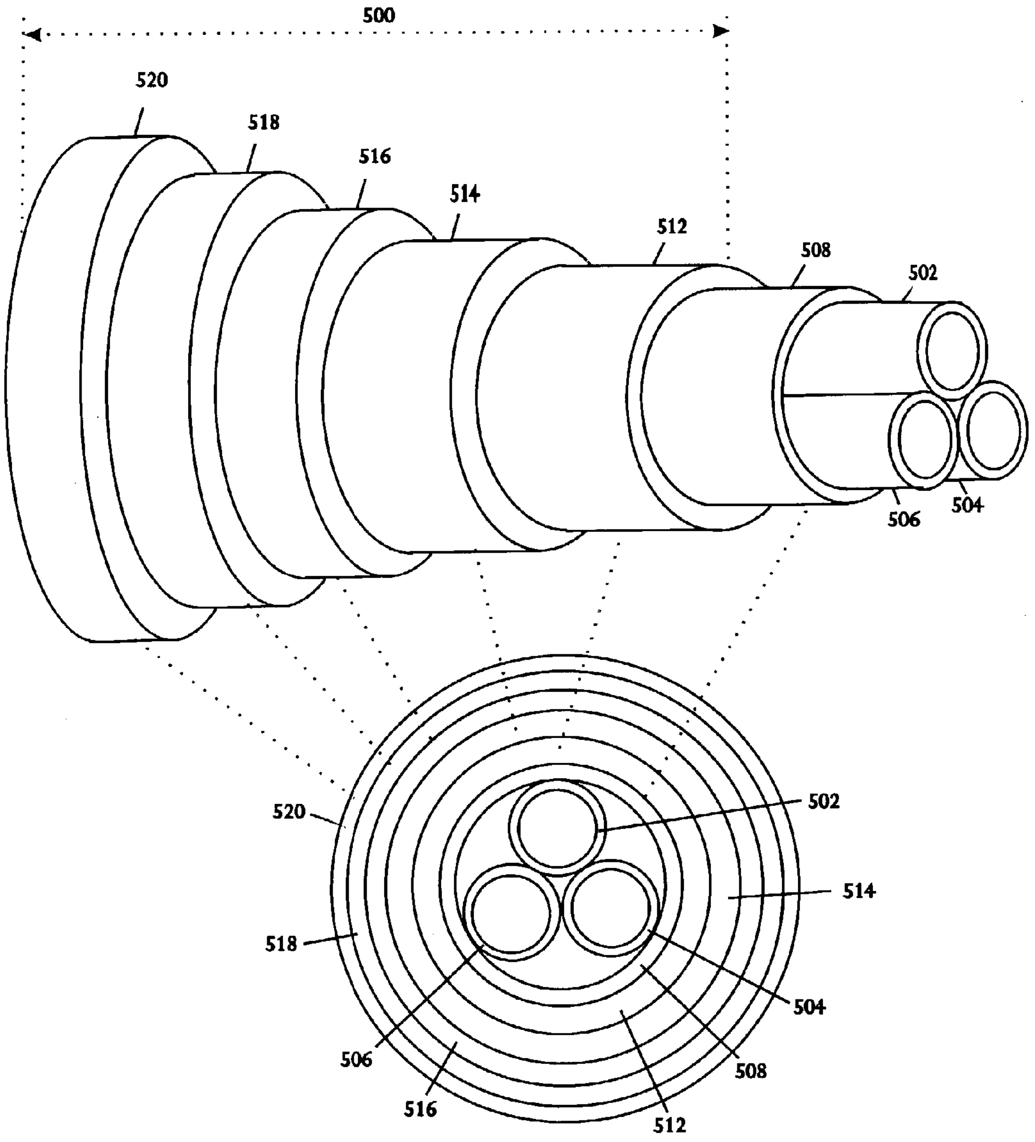
FIG. 5 is a pictorial diagram showing an example of a five-layer EMI reduction cable.
Figure 6:
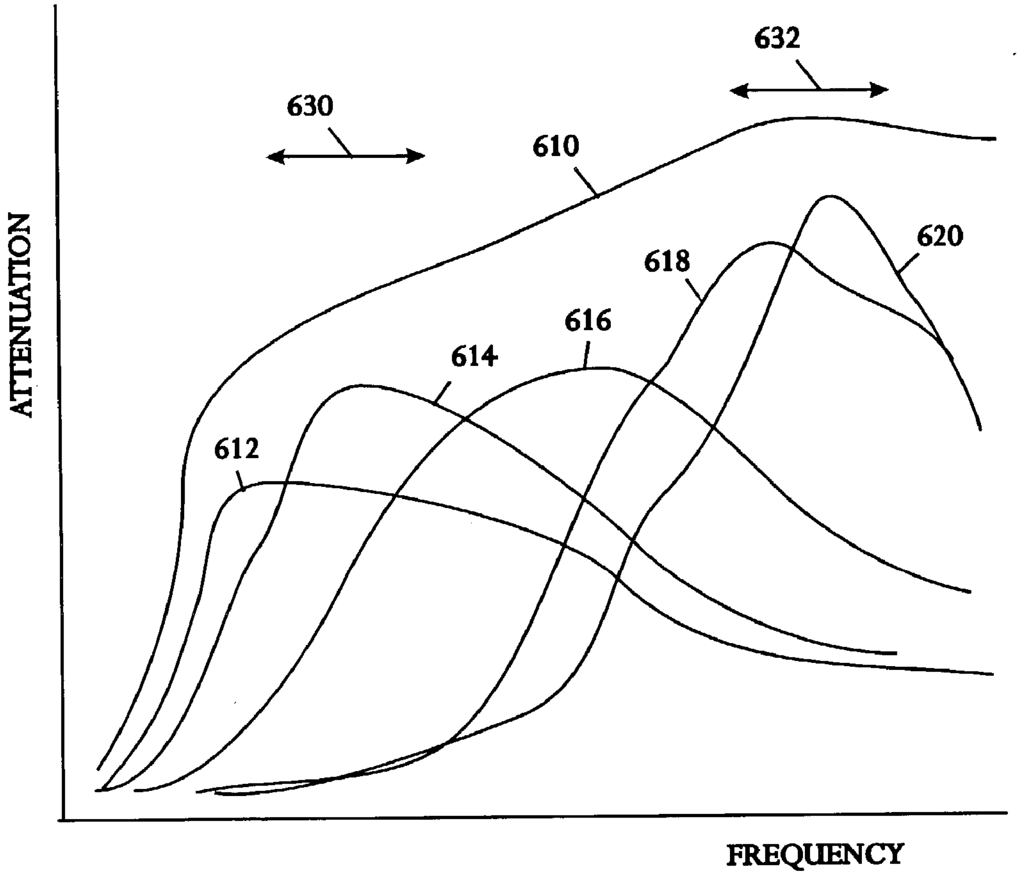
FIG. 6 is a frequency characteristic graph that results from the five-layer EMI reduction cable shown in FIG. 5.

Referring to FIG. 5, a pictorial diagram shows an example of a five layer EMI reduction cable 500 that protects three insulated cables or wires 502, 504, and 506. The illustrative five-layer shield 500 produces a frequency characteristic depicted in FIG. 6. Multiple coatings in separate sheaths 512, 514, 516, 518, and 520 overlying an optional braid shield 508 and coupled in adjacent layers can produce a greater attenuation than the same materials mixed in the same matrix. Multiple layer shielding permits usage of narrow spectrum absorbers 612, 614, 616, 618, and 620 to increase overall attenuation 610. Application of multiple lossy layers can permit selection of particular lossy materials to enhance reduction of particular problematic frequencies, for example in ranges 630 and 632. In the illustrative example, the multiple coatings in separate sheaths 512, 514, 516, 518, and 520 enables heightened attenuation of noise in particular predetermined ranges by integrating layers that attenuate at low frequency, high frequency, and several mid-range bands through usage of different lossy materials and/or concentrations in the various lossy layers.

The illustrative cable and wire coating system enables design of multiple coating layers 512, 514, 516, 518, and 520 and specification of the frequency coverage of the individual layers, thereby improving flexibility and efficiency, and reducing complexity, cost, and variety of inventory. A manufacturer can flexibly supply shielding materials for a broad range of applications and frequency bands while stocking a low number of lossy materials.

Although five layers are shown, any number of layers may be formed depending on the particular application, the frequencies to be attenuated, desired amount of attenuation, and suitable physical characteristics of the cable including flexibility, hardness, and weather and abrasion resistance. Generally up to 10 dB or more of attenuation are gained by a lossy layer. The number of layers may also be determined based on cost and manufacturing difficulty.

The illustrative lossy coating can be used for many purposes in many applications, for example in automotive, aviation, aerospace, military, industrial, power distribution, measurement/control, retail, commercial, transportation, entertainment, computer, communications, residential such as "smart house" applications, home entertainment, and other fields. The lossy coating can be used for telecommunications for radar, broadcast, and frequencies up to microwave. Automotive applications include but are not limited to ignition, control, interface, diagnostics, on-board entertainment, self-test. Military applications further include maritime and shipboard applications.

The lossy coatings can be used to shield sensitive systems, for example measuring circuits, high impedance circuits, and the like from incoming noise, enhancing noise immunity or decreasing susceptibility.

Figure 7:
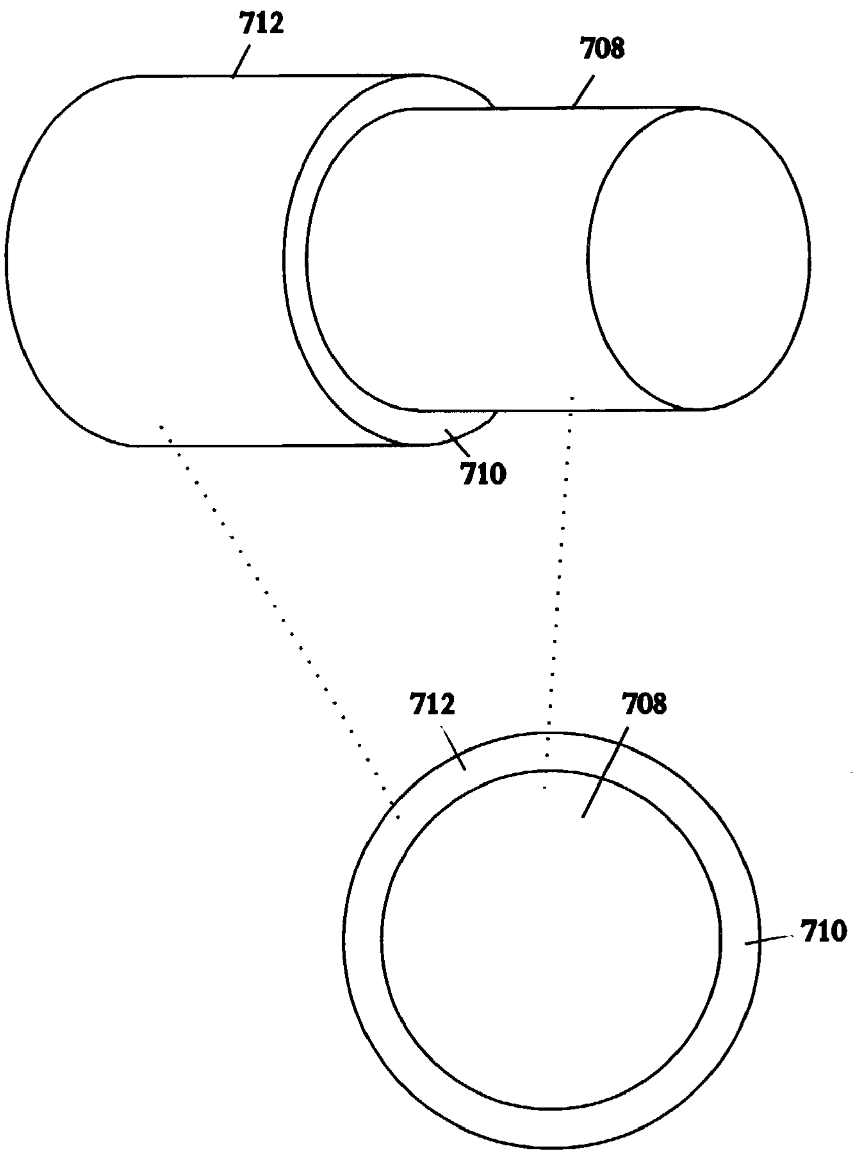
FIG. 7 is a highly schematic pictorial diagram illustrating an example of an unshielded wire or cable with one or more layers of lossy material with specified frequency characteristics that reduce electromagnetic emissions.

Referring to FIG. 7, a highly schematic pictorial diagram illustrates an example of an unshielded wire or cable 700 with a coating 710 comprising one or more lossy layers 712. The one or more lossy layers 712 are concentrically positioned around the core 708. The lossy layers 712 includes lossy material with specified frequency characteristics and encases an electrically conductive core of wire or cable 708 to reduce electromagnetic emissions. Shielding may be omitted, for example, if the two components, devices, or systems that are connected by the cable 700 are isolated. Shielding can be omitted to avoid electrical connection of the two isolated housings.

Figure 8:
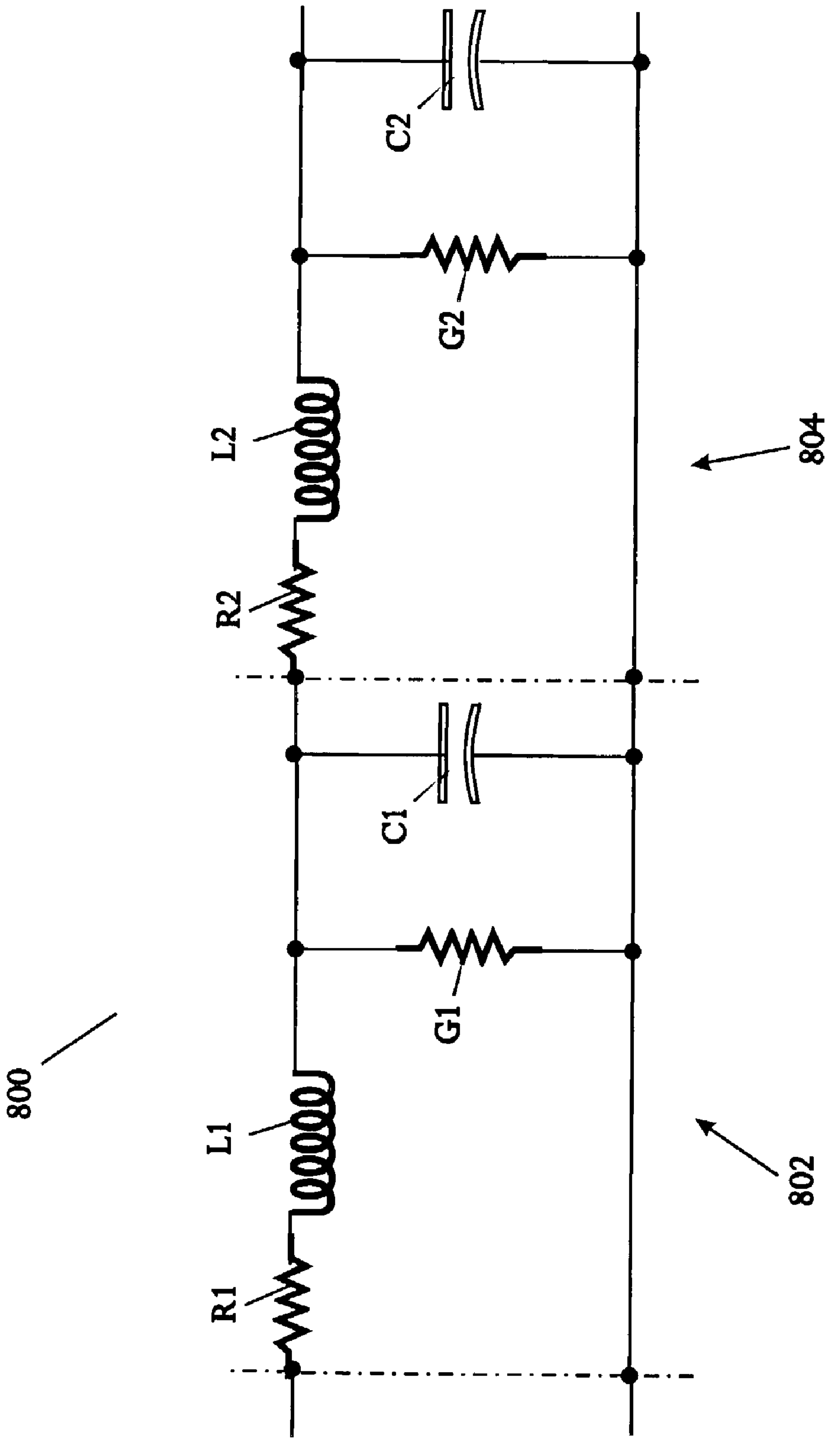
FIG. 8 is a schematic circuit diagram showing an example of an equivalent circuit for an interference protection system using multiple lossy layers.
Figure 9:
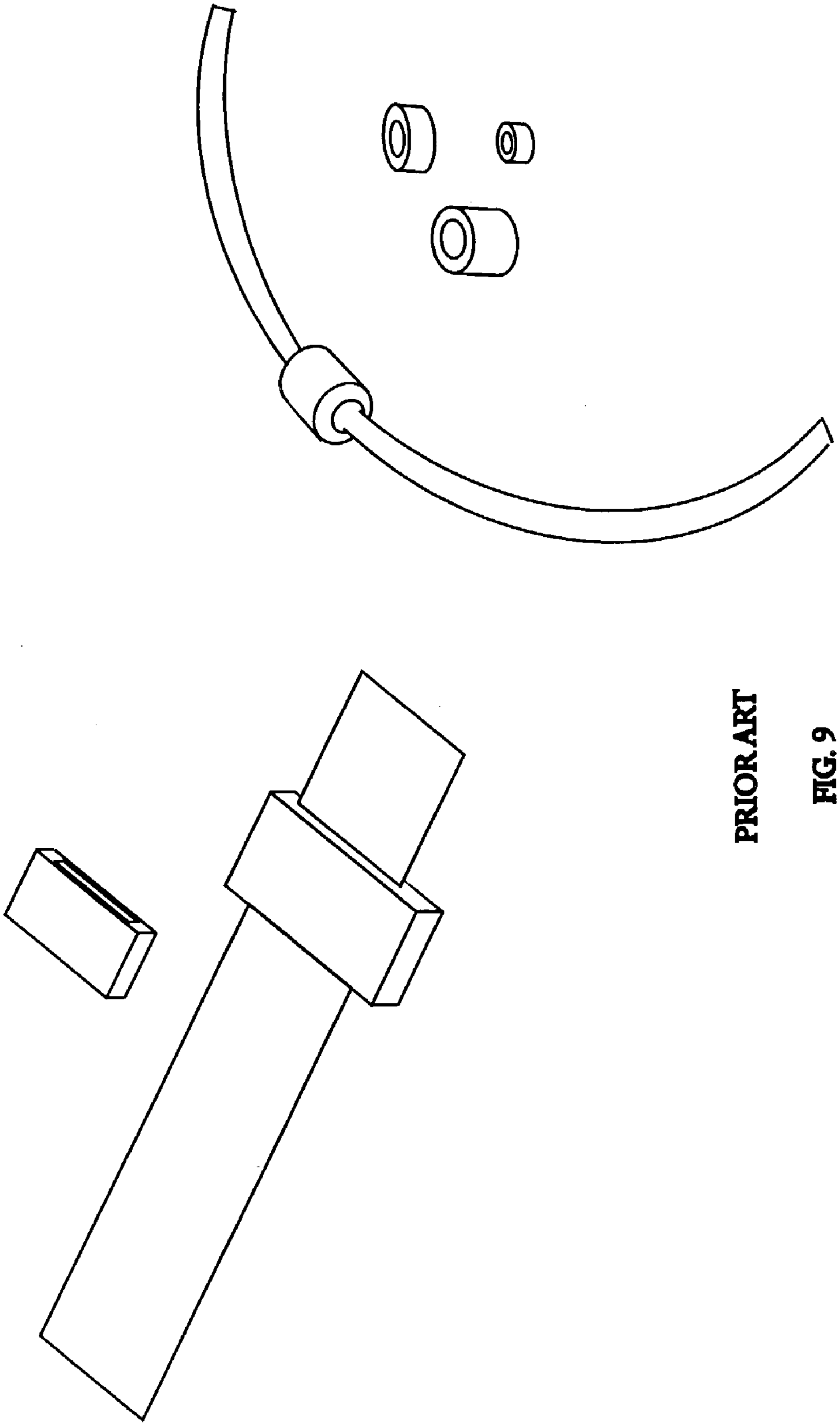
PRIOR ART FIG. 9
FIG. 9 is a pictorial diagram that illustrates several examples of conventional wire and cable shielding devices including toroids.

Referring to FIG. 8, a schematic circuit diagram shows an example of an equivalent circuit 800 for an interference protection cable using multiple lossy layers. The circuit diagram shows resistive (R), inductive (L), conductive (G), and capacitance (C) components combined into single components for the multiple lossy layers. The individual lossy layers 802 and 804 have different equivalent circuit components depending on the lossy materials within the layers.

The resistance R, capacitance C, and frequency f determine the propagation velocity Vp of the different cable portions. Low resistance and low capacitance cables have a higher velocity than cables with higher values of resistance or capacitance. Lossy layers form a relatively large inductance, causing the product of frequency and inductance to be much greater than resistance. The differing materials in the individual lossy layers create various contributions to the equivalent circuit in terms of resistive (R), inductive (L), conductive (G), and capacitance (C) components, resulting in multiple cascaded filter functions in the cable.

The usage of cables with one or more layers of lossy material improves EMI reduction performance as compared to cables with toroids. Toroids or local filtering reduces but does not eliminate interference so that noise signals may be carried by the metal shielding are radiated. The described cables eliminate EMI along the entire length of cabling.

In similar applications, lossy layers can be formed as a layer of a wall, for example by application to any suitable support member such as a woven rope, a heavy sheet, a sheet of metal, or any other suitably strong member.

The one or more lossy layers can continuously cover the isolated element such as cable or sheet, or can have one or more splits or gaps. Any gap should be sufficiently small to permit complete lines of flux that completely encircle a conductor.

Lossy material can be incorporated into the insulation or jacket by mixing into a molten thermoplastic insulating material or by extruding the lossy material or otherwise applying the lossy material around the cable or wire.

Cables with lossy layers extending along the cable length improve dissipation performance in comparison to usage of toroids or local filters on the basis that the toroids or local filters do not eliminate but simply reduce the amplitude of unwanted signals at the toroid or filter location. The reduced amplitude signals can propagate along cable shielding and radiate electromagnetic emissions. Longitudinal conversion loss measures balance between two individual conductors in a twisted pair. When conductors in a pair are mirror images, voltage returning down the conductors is equal, improving voltage cancellation and reducing radiation of electromagnetic emissions. Lossy layers extending throughout the cable improves balance and longitudinal conversion loss characteristics.

The lossy layers 112 can be manufactured using various techniques including layering, extruding, coating, wrapping, and the like, over the electrically conductive core 108. For example, a die commonly used in cable manufacture extrudes molten or semi-molten plastic over the conductive cores. The extrusion flows around the conductive core wires and cools during extrusion. For multiple layers, the cables pass through the extrusion process multiple times.

Extrusion is the process of forming a concentric pile of successive cured and hardened extrusions in the radial outward direction. Extrusions can be made as part of the manufacturing process for shielded cables and shielded housings for constituent cable subassemblies. The binder can be an extrudable, cure-hardened material that includes, before extrusion, a flowable resin component and a non-flowable component with resin particles that have been preliminarily cured and hardened and are pressure distortable. Typically, the lossy materials, when mixed with particular polymers, form easily extrudable compounds that are highly suitable for application to wires and cables. The lossy material-polymer mixture can be directly extruded over wire to form a combination that attenuates or filters high frequency interference on the cable line. High frequency signals conducted down the cable are partially absorbed by the lossy particle shield layer. Electromagnetic waves penetrating through to the shielding layer 112 are at least partially absorbed by the lossy particles and dissipated by lattice vibration or phonon emission. The shielding layer 112 protects against radio frequency propagating down the wire.

In a particular embodiment, ferrous alloy particles are mixed with a size range of 10–20 grains per square millimeter at a selected concentration, for example in a range of 5% to 85% by volume, with the binder, extrude the admixture and cure-harden, giving good homogenous (isotropic) conductivity throughout the material. The type and proportion of metal particles determines the frequency attenuation and shielding effectiveness of the individual layers.

The particles of lossy material can be loaded into the thermoplastic mixture during sheath formation by a conventional extrusion process that further includes sheath curing and hardening.

The various components can be manufactured as a single unit by sequentially extruding the concentric pile of sheaths or layers about the conductor. Alternatively, components can be manufactured separately and then assembled to form a completed cable.

The illustrative cables and lossy materials can be used in various applications, for example TEMPEST applications in which materials are selected for a wide range of radiation spectra. TEMPEST is the code name for technology capable of limiting unwanted electromagnetic emissions from data processing and related equipment. The TEMPEST goal is limiting an intruder's capability to collect information from the internal data flow of computer equipment.

TEMPEST technology is important for computers and other data processing equipment since such devices communicate using square wave signals and clock speeds that produce a particularly rich set of unintentional signals in a wide portion of the electromagnetic spectrum. Spurious emissions occupy so wide a portion of the frequency spectrum that technologies for blocking one portion are not necessarily effective in another portion. Unintentional emissions from a computer system can be intercepted and decoded to give information from simple activity levels to remote copying of keystrokes or monitor information capture. Poorly protected systems can be effectively monitored for distances up one or more kilometers.

TEMPEST is intended to protect systems susceptible to intrusion or damage from Electromagnetic Interference (EMI), including the Electromagnetic Pulse (EMP) from nuclear weapons. To ensure communications security, TEMPEST is to prevent compromising emanations. Many defense-related facilities require EMI, EMP, or TEMPEST protection. Historically, a metallic liner or shield has provided protection by completely enclosing the electronics systems. The conservative designs typically provide more shielding than required and are very expensive to design, construct, test, and maintain.

U.S. Army Construction Engineering Research Laboratories (CERL) has experimented with low-cost electromagnetic shielding designs for several years including shielding materials such as conductive polymers, amorphous metals and intercalated graphites, and advanced coatings for use on shield components. CERL has also investigated inherent shielding of standard construction materials including aluminum-foil-backed gypsum board, aluminum-foil-backed insulating sheathing, metallic-clad siding, copper foils normally used for vapor barriers, wire meshes, and sheet metal roofing.

The illustrative lossy materials can be used to reduce EMI and EMP in TEMPEST applications.

Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. For example, although the illustrative cables have a round cross section, in other embodiments various other types of cables such as flat or ribbon cables may be coated with lossy materials. Various combinations of lossy layers and high permeability layers may be used.

What is claimed is:

1. An apparatus comprising:

a conductor; and a lossy coating encasing the conductor and comprising a plurality of lossy layers in separate sheaths in adjacent layers, the plurality of lossy layers further comprising:

a binder; and a lossy material mixed into the binder, the lossy material being selected to attenuate electromagnetic interference frequencies in a narrow or moderate band, individual lossy layers of the plurality of lossy layers having different compositions selected to attenuate frequencies in different frequency bands.

2. An apparatus according to claim 1 further comprising:

a lossy material mixed into the binder that is controlled in composition and in concentration within the binder to attenuate frequency within a predetermined frequency band.

3. An apparatus according to claim 1 wherein:

the conductor is an electronic device in an anechoic chamber within a housing and the plurality of lossy layers encase a housing surface.

4. An apparatus according to claim 1 further comprising:

the individual lossy layers of the plurality of lossy layers having different lossy materials or different combinations of lossy materials, and different concentrations of lossy materials within the elastomeric binder matrix to control attenuation of frequencies in multiple frequency bands among the different individual lossy layers.

5. An apparatus according to claim 1 further comprising:

a braid shield encasing the conductor and forming a shield layer.

6. An apparatus according to claim 1 wherein:

the conductor is a wire or cable and the plurality of lossy layers encase an outer circumferential surface of the wire or cable.

7. An apparatus according to claim 1 further comprising:

a braid shield coupled on an outer surface of the conductor wherein:

the conductor is a wire or cable and the braid shield encases an outer circumferential surface of the wire or cable, the plurality of lossy layers encasing an outer circumferential surface of the braid shield.

8. An apparatus according to claim 1 wherein:

the lossy material mixed into the binder in the plurality of lossy layers is selected from among a group of materials consisting of nickel-zinc (NiZn) ferrites, manganese-zinc (MnZn) ferrites, flakes of magnetic amorphous alloy, other ferrites, high permeability iron-based (ferrous) alloy, high permeability iron-based alloy such as 4–79 Permalloy, MUMETAL®, Hymu 80, 45 Permalloy, and 50% nickel iron, ferromagnetics, nickel, iron, nickel-iron alloys, silicon-iron alloys, cobalt-iron alloys, steel, mumetal, permalloy, supermalloy, supermumetal, nilomag, sanbold.

9. An apparatus according to claim 1 wherein:

the lossy material mixed into the binder in the plurality of lossy layers is selected from among a group of materials consisting of metal-coated lossy particles fabricated using electrodeposition and vacuum deposition such as ferrites, magnetites or a blend of ferrites and magnetites and other soft-magnetic, homogeneous ceramic materials composed of iron oxide ($Fe_2O_3$) with carbonates or oxides of one or more bivalent metals such as manganese, zinc, nickel, or magnesium.

10. An apparatus according to claim 1 wherein:

the lossy material mixed into the binder in the plurality of lossy layers is selected from among a group of materials consisting of ferromagnetic particles mixed with other metal particles including one or more of copper, silver, silver-coated copper, nickel, manganese, zinc, and others into a polymer matrix.

11. An apparatus according to claim 1 wherein:

the lossy material mixed into the binder in the plurality of lossy layers is selected from among a group of materials consisting of metal-coated particles in combination with metal particles, core materials for the metal-coated particles including vitreous mineral such as glass, silicates of aluminum, magnesium, calcium, kevlar, graphite, carbon powders, carbon particles, mica, and composites.

12. An apparatus according to claim 1 wherein:

the binder in the plurality of lossy layers is selected from among a group of materials consisting of elastomers, thermoplastics, poly-vinyl-chloride (PVC), polyethylene (PE), polypropylene (PP), specially formulated plastics, thermoplastic resins such as polycarbonates, polyesters, polyetheresters, polyestercarbonates, polyamides, polyamideimides, polystyrenes, polyethers, polyetherimides, polyaryleneethers, acrylonitrile-butadiene-styrene copolymers, and combinations of two or more thermoplastic resins.

13. An electromagnetic interference-protected cable comprising:

one or more interior conductor cables;

a shield coupled to and encasing the one or more interior conductor cables; and a plurality of lossy layers in separate sheaths in adjacent layers coupled to and encasing the shield and the one or more interior conductor cables, individual lossy layers of the plurality of lossy layers having different compositions selected to attenuate frequencies in multiple different frequency bands.

14. A cable according to claim 13 wherein:

lossy layers of the plurality of lossy layers further comprise:

a thermoplastic base material; and a lossy material mixed into the thermoplastic base material, the lossy material being selected to attenuate electromagnetic interference frequencies in a narrow or moderate band.

15. A cable according to claim 13 wherein:

the electromagnetic interference attenuation of the plurality of lossy layers in combination exceeds attenuation of a single broad band lossy material.

16. A cable according to claim 13 wherein:

lossy layers of the plurality of lossy layers further comprise:

a thermoplastic base material; and a lossy material mixed into the thermoplastic base material, individual lossy layers of the plurality of lossy layers having different lossy materials or different combinations of lossy materials, and different concentrations of lossy materials within the thermoplastic base material to control attenuation of frequencies in multiple frequency bands.

17. A method for protecting against electromagnetic interference and electromagnetic pulse signals comprising:

determining an interference frequency band within which electromagnetic interference is to be attenuated;

mixing a lossy material into a binder in a composition and concentration that attenuates electromagnetic interference in the determined frequency band;

forming the mixed lossy material and binder over a conductor; and mixing lossy materials into binders in a plurality of compositions and concentrations into a respective plurality of lossy layers in separate, adiacent sheaths for attenuating electromagnetic interference in a plurality of frequency bands.

18. A method according to claim 17 further comprising: extruding a plurality of layers of lossy material and binder in a plurality of compositions and concentrations to attenuate electromagnetic interference in a plurality of frequency bands that function in combination to increase the overall attenuation over the attenuation of a single broadband layer.

* * * * *